United States Patent
Kato et al.

(10) Patent No.: US 8,084,729 B2
(45) Date of Patent: Dec. 27, 2011

(54) PHOTOELECTRIC CONVERSION APPARATUS, IMAGING SYSTEM, AND PHOTOELECTRIC CONVERSION APPARATUS MANUFACTURING METHOD

(75) Inventors: Satoshi Kato, Kawasaki (JP); Hirofumi Totsuka, Fujisawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 326 days.

(21) Appl. No.: 12/496,114

(22) Filed: Jul. 1, 2009

(65) Prior Publication Data
US 2010/0006743 A1    Jan. 14, 2010

(30) Foreign Application Priority Data
Jul. 9, 2008   (JP) ................................. 2008-179468

(51) Int. Cl.
*H01L 27/00* (2006.01)
(52) U.S. Cl. .................. 250/208.1; 250/226; 348/273; 257/294; 438/70
(58) Field of Classification Search ............... 250/208.1, 250/214.1, 226; 348/272–274, 281; 257/294, 257/432; 438/70
See application file for complete search history.

(56) References Cited

U.S. PATENT DOCUMENTS

| | | | |
|---|---|---|---|
| 6,133,062 A | 10/2000 | Pai et al. | 438/70 |
| 7,286,170 B2 | 10/2007 | Inui et al. | 348/241 |
| 2007/0279503 A1 | 12/2007 | Totsuka | 348/283 |
| 2008/0036890 A1 | 2/2008 | Yamashita et al. | 348/308 |
| 2009/0141157 A1* | 6/2009 | Kobayashi et al. | 348/308 |
| 2009/0200449 A1 | 8/2009 | Iwata et al. | 250/206 |
| 2010/0328509 A1* | 12/2010 | Yamashita et al. | 348/300 |

FOREIGN PATENT DOCUMENTS
JP  11-330444 A   11/1999
JP  2004-153682 A   5/2004

* cited by examiner

*Primary Examiner* — Kevin Pyo
(74) *Attorney, Agent, or Firm* — Fitzpatrick, Cella, Harper & Scinto

(57) ABSTRACT

A photoelectric conversion apparatus having a pixel array region and a peripheral region includes a pixel array, a readout unit, an output unit, a plurality of output lines, and a color filter layer which is arranged in the pixel array region and the peripheral region and includes a color filter arranged above the plurality of pixels. The color filter layer extends to surround the output lines when viewed from a direction perpendicular to a surface of a semiconductor substrate, and has an opening arranged above the plurality of output lines. The opening of the color filter layer is filled with gas or an insulator lower in dielectric constant than the color filter.

12 Claims, 8 Drawing Sheets

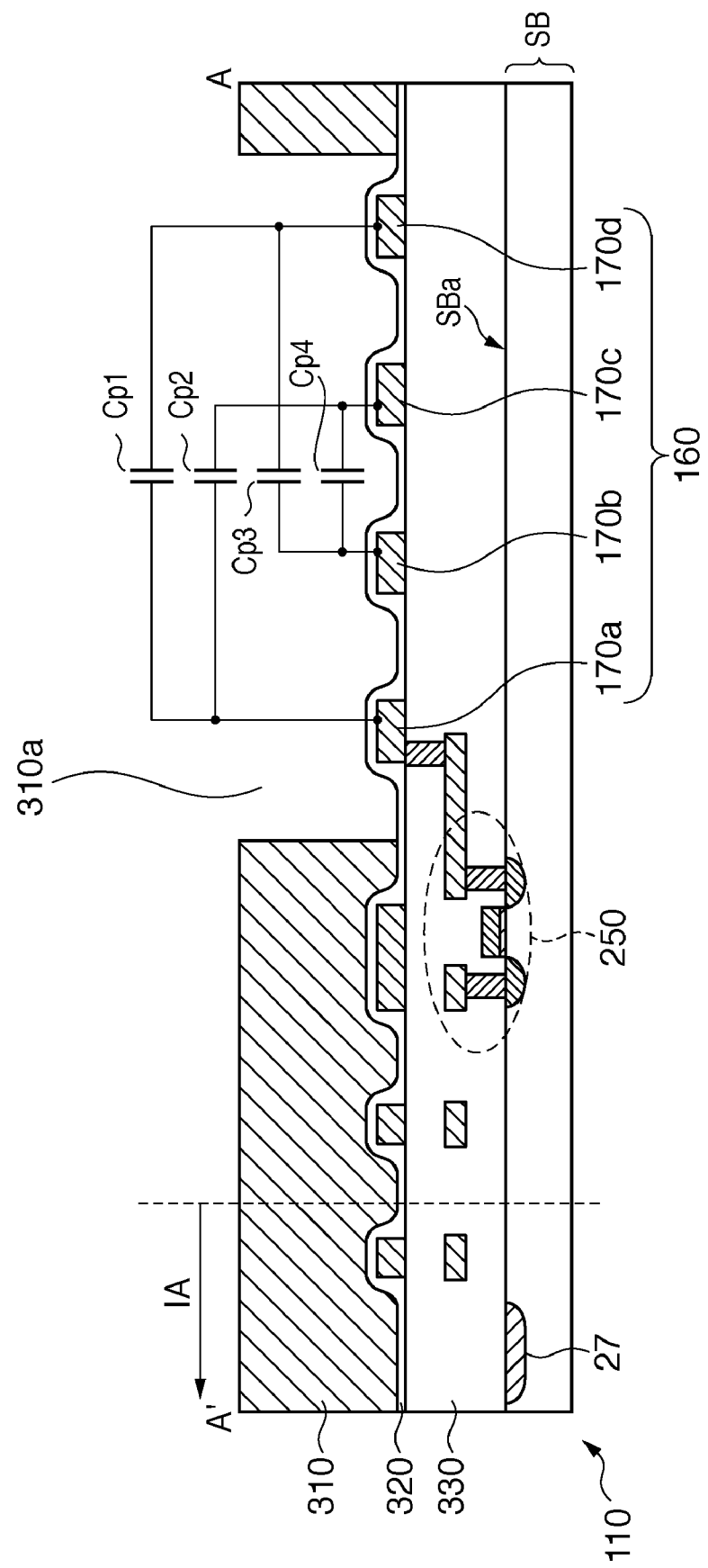

t=0 t=t1

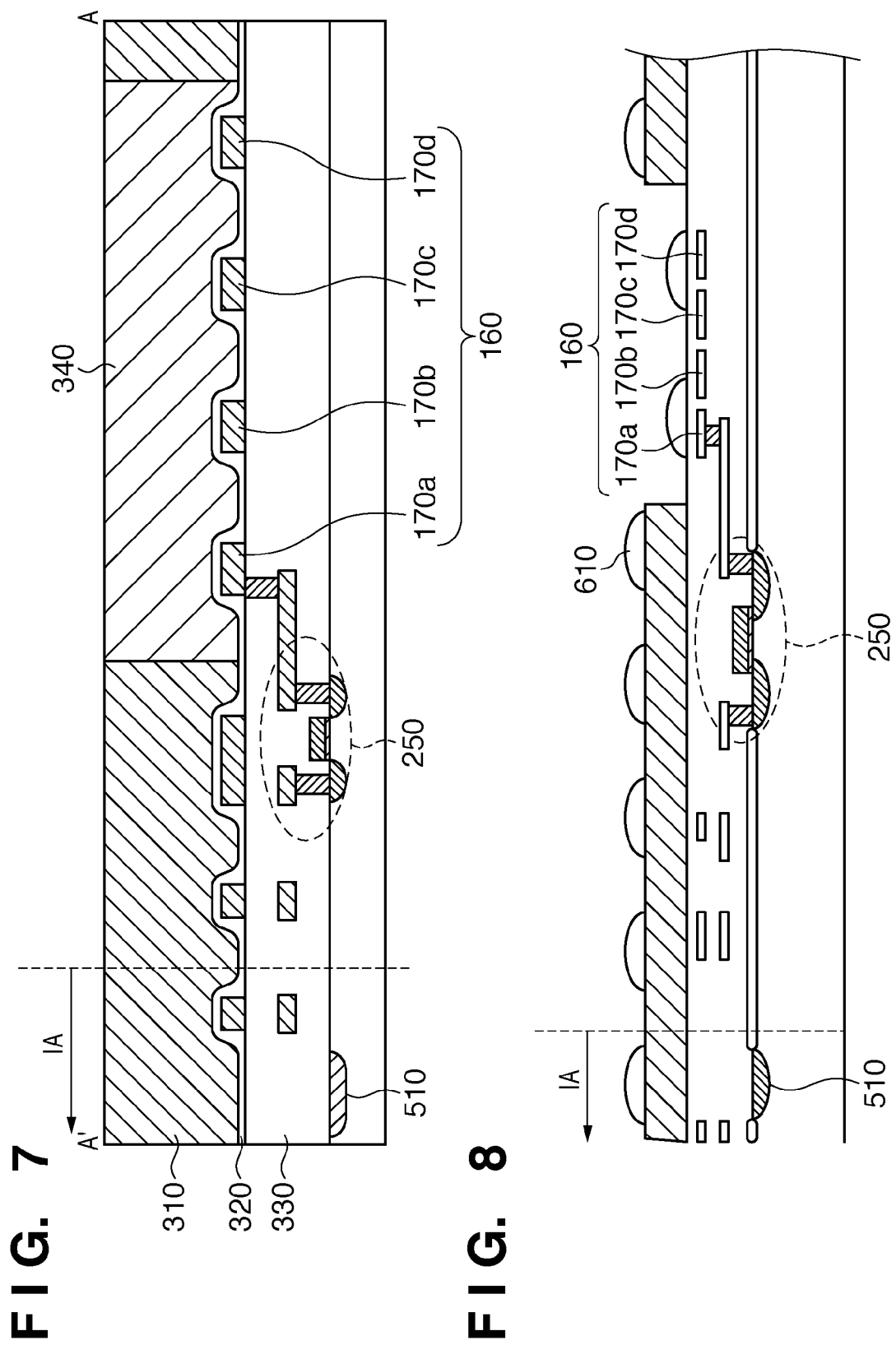

PHOTOELECTRIC CONVERSION APPARATUS, IMAGING SYSTEM, AND PHOTOELECTRIC CONVERSION APPARATUS MANUFACTURING METHOD

BACKGROUND OF THE INVENTION

1. Field of the Invention

The present invention relates to a photoelectric conversion apparatus, imaging system, and photoelectric conversion apparatus manufacturing method.

2. Description of the Related Art

Photoelectric conversion apparatuses are roughly divided into a CCD (Charge Coupled Device) sensor and a CMOS (Complementary MOS) sensor. Early CMOS sensors generated large noise and were poorer in image quality than CCD sensors. However, today's advanced noise reduction technology allows CMOS sensors to attain image qualities equivalent to those of CCD sensors.

Japanese Patent Laid-Open No. 2004-153682 achieves high readout speeds by arranging two pairs of optical signal output lines (to be referred to as S output lines hereinafter) and noise signal output lines (to be referred to as N output lines hereinafter), and arranging two S/N readout circuits for amplifying and reading out difference signals from the two output lines. These output lines are arranged in order of the first S output line, first N output line, second N output line, and second S output line. This arrangement order makes the first S output line spaced apart from the second S and N output lines, reducing the coupling capacitance formed between the first S output line and the second S and N output lines. Similarly, the order makes the second S output line spaced apart from the first S and N output lines, decreasing the coupling capacitance formed between the second S output line and the first S and N output lines. The technique disclosed in Japanese Patent Laid-Open No. 2004-153682 can reduce crosstalk arising from capacitive coupling between two pairs of S output lines and N output lines.

Japanese Patent Laid-Open No. 11-330444 discloses a technique of forming a dummy pattern in a predetermined non-filter region except the array of color filters. The technique disclosed in Japanese Patent Laid-Open No. 11-330444 can assure the flatness of a planarization layer on the color filters to prevent defocusing and an image blur, and avoid degradation of the image quality caused by ambient scattered light. The technique can therefore improve the image quality of an image obtained by a CMOS sensor.

According to the technique disclosed in Japanese Patent Laid-Open No. 11-330444, a dummy pattern is formed of the same substance as a color filter to ensure the flatness of a planarization layer on the color filter. It is estimated that the dummy pattern is arranged in a large region except the pixel array region.

It is also estimated that, if the technique of Japanese Patent Laid-Open No. 11-330444 is applied to that of Japanese Patent Laid-Open No. 2004-153682, a dummy pattern is arranged even on two pairs of N output lines and S output lines. In this case, the dummy pattern raises the dielectric constant between output lines, compared to a case in which no dummy pattern for a color filter is formed on a plurality of output lines. The high dielectric constant between output lines owing to the dummy pattern increases the coupling capacitance between them. The coupling capacitance between the output lines may increase crosstalk.

As the distance between output lines is shortened at a high dielectric constant between them for reduction of the chip size, the coupling capacitance becomes larger in accordance with the shorter distance between them. This hinders shortening the distance between output lines by a predetermined amount or more, failing to downsize the chip.

SUMMARY OF THE INVENTION

The present invention provides for reducing crosstalk between output lines.

According to the first aspect of the present invention, there is provided a photoelectric conversion apparatus having a pixel array region and a peripheral region positioned at a periphery of the pixel array region, the apparatus comprising: a pixel array which is arranged in the pixel array region and has a plurality of pixels arrayed; a readout unit which is arranged in the peripheral region to read out a signal from the pixel array; an output unit which is arranged in the peripheral region; a plurality of output lines which are arranged in the peripheral region to transfer signals from the readout unit to the output unit; and a color filter layer which is arranged in the pixel array region and the peripheral region and includes a color filter arranged above the plurality of pixels, wherein the color filter layer extends to surround the plurality of output lines when viewed from above the plurality of output lines, and has an opening arranged above the plurality of output lines, and the opening of the color filter layer is filled with either of gas and an insulator lower in dielectric constant than the color filter.

According to the second aspect of the present invention, there is provided an imaging system comprising: a photoelectric conversion apparatus according to the first aspect of the present invention; an optical system which guides light to a pixel array of the photoelectric conversion apparatus; and a signal processing unit which processes a signal output from the photoelectric conversion apparatus to generate image data.

According to the third aspect of the present invention, there is provided a method of manufacturing a photoelectric conversion apparatus having a pixel array region and a peripheral region positioned at a periphery of the pixel array region, the method comprising steps of: forming, in the pixel array region, a pixel array having a plurality of pixels arrayed, and forming, in the peripheral region, a readout unit which reads out a signal from the pixel array, an output unit, and a plurality of output lines which transfer signals transferred from the readout unit to the output unit; forming a first resin layer including a color filter in the pixel array region and the peripheral region; forming a second resin layer on the first resin layer in the pixel array region and the peripheral region; planarizing an upper face of the second resin layer; and removing portions of the first resin layer and second resin layer that are positioned above the plurality of output lines, thereby forming openings in the first resin layer and the second resin layer, wherein the openings of the first resin layer and the second resin layer are filled with either of gas and an insulator lower in dielectric constant than the color filter.

The present invention can reduce crosstalk between output lines.

Further features of the present invention will become apparent from the following description of exemplary embodiments with reference to the attached drawings.

BRIEF DESCRIPTION OF THE DRAWINGS

FIG. 4 is a schematic sectional view taken along a line A-A' in FIG. 3;

FIG. 7 is a sectional view of the structure of a photoelectric conversion apparatus according to a modification to the first embodiment of the present invention;

FIG. 8 is a sectional view of the structure of a photoelectric conversion apparatus according to another modification to the first embodiment of the present invention;

DESCRIPTION OF THE EMBODIMENTS

Figure 1:
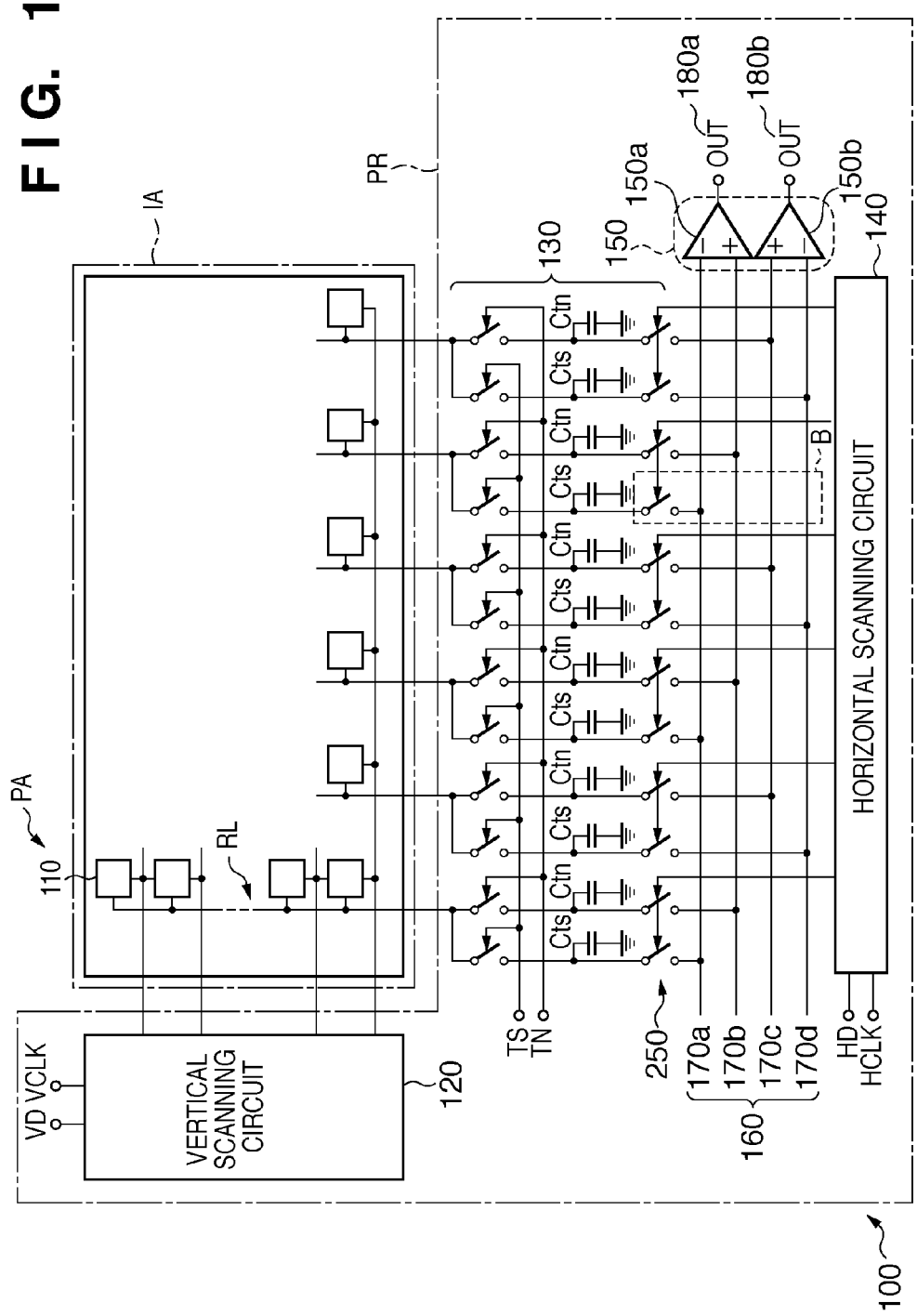
FIG. 1 is a diagram of the arrangement of a photoelectric conversion apparatus 100 according to the first embodiment of the present invention.
Figure 2:
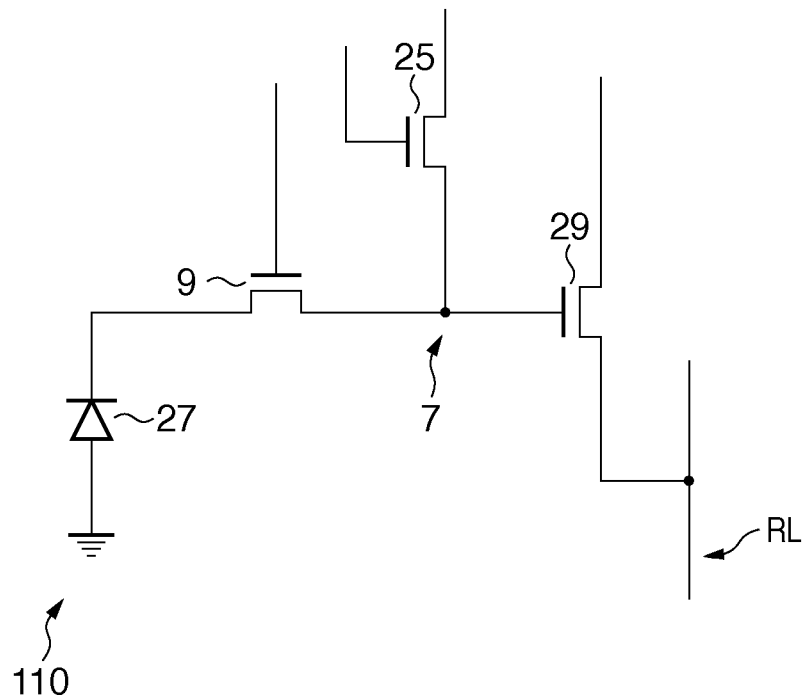
FIG. 2 is a circuit diagram showing the structure of a pixel in the photoelectric conversion apparatus 100.
Figure 3:
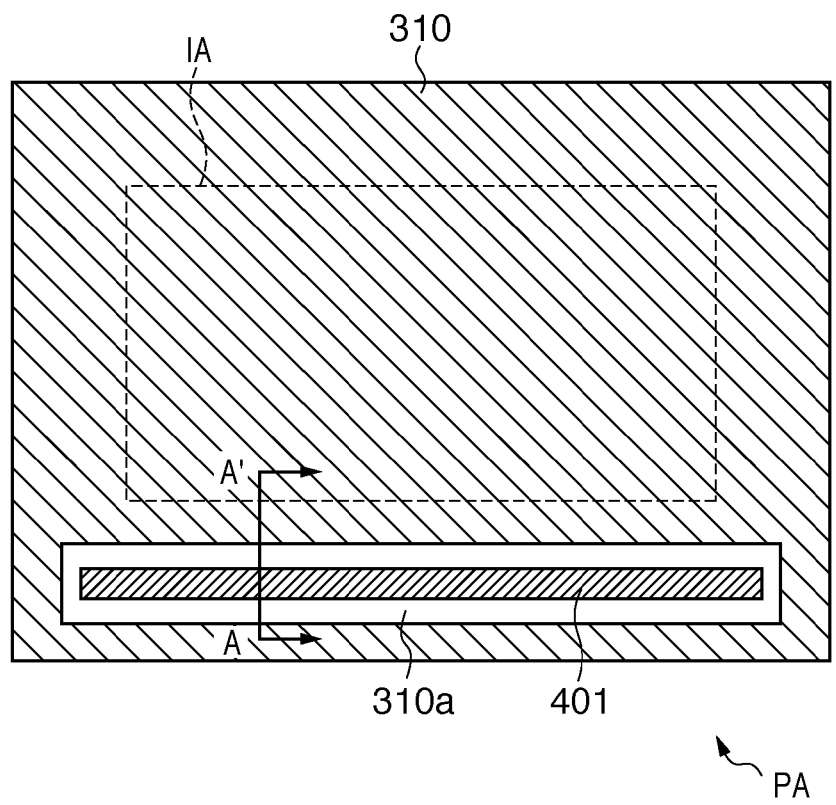
FIG. 3 is a plan view showing the structure of a color filter layer in the photoelectric conversion apparatus 100.

The arrangement of a photoelectric conversion apparatus 100 according to the first embodiment of the present invention will be described with reference to FIGS. 1 to 3. FIG. 1 is a diagram of the arrangement of the photoelectric conversion apparatus 100 according to the first embodiment of the present invention. FIG. 2 is a circuit diagram showing the structure of a pixel in the photoelectric conversion apparatus 100. FIG. 3 is a plan view showing the structure of a color filter layer in the photoelectric conversion apparatus 100.

The photoelectric conversion apparatus 100 includes a pixel array region IA and peripheral region PR. The pixel array region IA is, for example, a region where an object image is formed and sensed. The peripheral region PR is positioned at the periphery of the pixel array region IA.

A pixel array PA is arranged in the pixel array region IA. The peripheral region PR includes a vertical scanning circuit 120, readout circuit (readout unit) 130, horizontal scanning circuit 140, output line group (a plurality of output lines) 160, and output unit 150. A color filter layer 310 (see FIGS. 3 and 4) is arranged in the pixel array region IA and peripheral region PR.

In the pixel array PA, a plurality of pixels 110 are arrayed two-dimensionally (directions along a row and a column). As shown in FIG. 2, each pixel 110 includes a reset transistor 25, photoelectric conversion unit 27, transfer gate 9, floating diffusion (to be referred to as an FD hereinafter) 7, and amplification transistor 29. The reset transistor 25 resets the FD 7. The photoelectric conversion unit 27 generates charges (signal) corresponding to incident light by photoelectric conversion, and accumulates them. The photoelectric conversion unit 27 is, for example, a photodiode. The transfer gate 9 transfers charges (signal) accumulated in the photoelectric conversion unit 27 to the FD 7. The FD 7 converts the transferred charges (signal) into a voltage (signal). The amplification transistor 29 amplifies a signal input from the FD 7 and outputs the amplified signal to a column signal line RL. The amplification transistor 29 outputs a noise signal to the column signal line RL while the FD 7 has been reset. The amplification transistor 29 outputs an optical signal to the column signal line RL while the charges have been transferred from the photoelectric conversion unit 27 to the FD 7.

Note that the noise signal is output from a pixel while the FD 7 has been reset, so it can also be referred to as a reset signal. The noise signal can be a reference signal for the optical signal such as a signal including an offset of a readout path.

The vertical scanning circuit 120 scans the pixel array PA vertically to select the pixels 110 of each row. Upon receiving control signals VD and VCLK, the vertical scanning circuit 120 supplies the pixel array PA with a signal for selecting the pixel 110 and a signal for driving it.

The readout circuit 130 reads out a signal from the pixel array PA. The readout circuit 130 includes a readout switch, holding capacitances Cts and Ctn, and a horizontal transfer switch for every column of the pixel array PA. The holding capacitance Cts receives an optical signal output via the column signal line RL and readout switch from the pixel 110 selected by the vertical scanning circuit 120, and holds it. The holding capacitance Ctn receives a noise signal output via the column signal line RL and readout switch from the pixel 110 selected by the vertical scanning circuit 120, and holds it. A horizontal transfer switch 250 connects/disconnects the holding capacitances Cts and Ctn to/from the output line group 160. In the connected state, the horizontal transfer switch 250 transfers signals held in the holding capacitances Cts and Ctn to the output line group 160.

The readout circuit 130 functions as a memory for temporarily accumulating signals of one row, so it can also be referred to as a line memory.

The horizontal scanning circuit 140 scans the readout circuit 130 horizontally to sequentially transfer optical signals held in the holding capacitances Cts of two columns to the output line group 160. Also, the horizontal scanning circuit 140 sequentially transfers noise signals held in the holding capacitances Ctn of two columns to the output line group 160. Upon receiving control signals HD and HCLK, the horizontal scanning circuit 140 supplies the readout circuit 130 with a control signal for transferring signals held in the holding capacitances Cts and Ctn of every two columns to the output line group 160.

The output line group 160 transfers optical and noise signals of two columns received from the readout circuit 130 to the output unit 150.

The output line group 160 includes a plurality of first output lines and a plurality of second output lines. The first output line transfers an optical signal (first signal) output from the readout circuit 130. The second output line transfers a noise signal (second signal) output from the readout circuit 130. More specifically, as shown in FIG. 1, the output line group 160 includes a first S output line (first output line) 170a, first N output line (second output line) 170b, second S output line (first output line) 170d, and second N output line (second output line) 170c. The first S output line 170a and first N output line 170b are paired while the second S output line 170d and second N output line 170c are paired.

The output unit 150 includes a plurality of differential amplifiers (differential circuits) 150a and 150b. The differential amplifiers 150a and 150b generate difference signals between optical signals and noise signals respectively transferred via the pairs of first and second output lines. The differential amplifiers 150a and 150b output the generated difference signals via output terminals 180a and 180b. It should be noted that each of the differential amplifiers 150a and 150b can amplify the optical signal and noise signal respectively so that the following stage (e.g. the sensed signal processing circuit 95) can generate the difference signal between the optical signal and noise signal.

As shown in FIG. 3, the color filter layer 310 includes a plurality of color filters above the pixels 110. Each of the color filters selectively transmits light of a predetermined wavelength (e.g., R G, or B wavelength) in a visible region so that the light of the predetermined wavelength enters a pixel. The color filter layer 310 extends from a pixel array region IA to the peripheral region PR. The color filter layer 310 has an opening 310a above the output line group 160 (in an output line formation region 401). The color filter layer 310 is formed to cover the entire region except the output line formation region 401. In other words, the color filter layer 310 extends to surround the output lines 170a to 170d when viewed from a direction perpendicular to a surface SBa of a semiconductor substrate SB (when viewed from above the output lines 170a to 170d) and has the opening 310a above the output lines 170a to 170d. With this structure, it is easy to ensure the flatness of upper face of the color filter layer 310.

Note that the color filter layer may include a single-layered color filter (i.e. a single panel) of a single color. Whether the color filter includes the plurality of color filters or the single-layered color filter is arbitrarily settable. The color filter layer may also be removed from an end of the output line formation region 401 on the side of the pixel array region IA. In other words, the opening 310a may extend near the side of the pixel array region IA.

The relationship between the crosstalk amount and coupling capacitance between output lines will be explained with reference to FIG. 4. FIG. 4 is a schematic sectional view taken along a line A-A' in FIG. 3.

The photoelectric conversion unit 27 is formed as a semiconductor region in the semiconductor substrate SB.

The horizontal transfer switch 250 is formed as a MOS transistor having a source and drain formed as two semiconductor regions in the semiconductor substrate SB, and a gate formed as an electrode on the semiconductor substrate SB.

An interlayer insulation film 330 is arranged on the semiconductor substrate SB. An uppermost wiring layer including the output line group 160 is arranged on the interlayer insulation film 330.

A passivation layer 320 is arranged to cover the uppermost wiring layer including the output line group 160. The passivation layer 320 is made of, for example, SiN. The passivation layer 320 ensures the durability of the wiring layer and semiconductor element.

The color filter layer 310 is arranged on the passivation layer 320. The opening 310a of the color filter layer 310 exposes a portion of the surface of the passivation layer 320 that covers the output line group 160. Gas (e.g., air) fills the opening 310a of the color filter layer 310.

As shown in FIG. 4, coupling capacitances Cp1 to Cp4 are formed between the output lines of the output line group 160. More specifically, the coupling capacitance Cp2 is formed between the first S output line 170a and the second N output line 170c. The coupling capacitance Cp1 is formed between the first S output line 170a and the second S output line 170d. The coupling capacitance Cp4 is formed between the first N output line 170b and the second N output line 170c. The coupling capacitance Cp3 is formed between the first N output line 170b and the second S output line 170d. In the following description of FIGS. 5A and 5B, the coupling capacitance Cp3 will be explained as a coupling capacitance Cp for descriptive convenience.

Figure 5A:
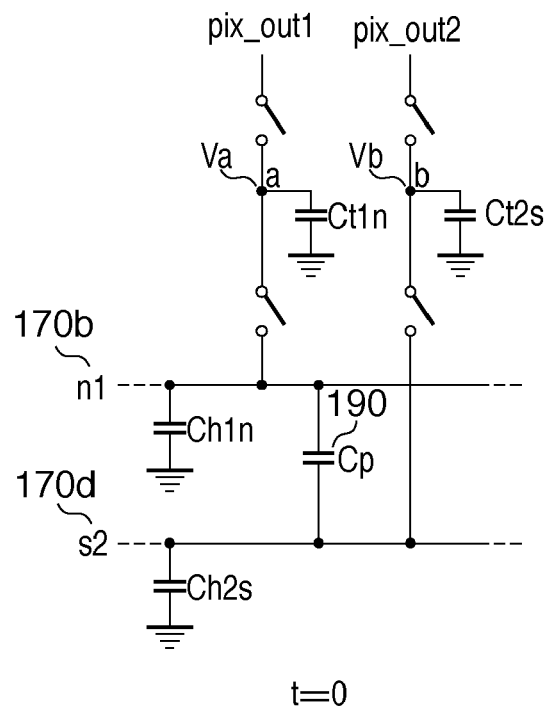
FIGS. 5A and 5B are equivalent circuit diagrams showing the relationship between the output line and the capacitance in FIG. 1.
Figure 5B:
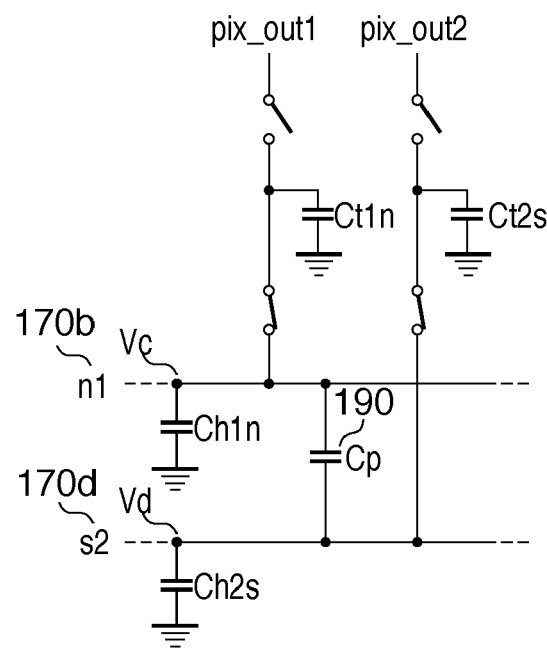

Variation of voltage of the second S output line 170d and the first N output line 170b arising from the coupling capacitance Cp will be described with reference to equivalent circuits in FIGS. 5A and 5B. FIG. 5A shows an equivalent circuit of the first N output line 170b and second S output line 170d before holding capacitances Ct1n and Ct2s transfer signals to the output lines (t=0). FIG. 5B shows an equivalent circuit of the first N output line 170b and second S output line 170d when the holding capacitances Ct1n and Ct2s transfer signals to the output lines (t=t1). In the equivalent circuits of FIGS. 5A and 5B, Ch1n represents the parasitic capacitance of the first N output line 170b, and Ch2s represents that of the second S output line 170d.

Sampling of a noise signal to the holding capacitance Ct1n and that of an optical signal to the holding capacitance Ct2s are assumed to have ended at t=0. The voltage of each node is defined as follows.

In FIG. 5A, the holding capacitance Ct1n is a sample/hold capacitance for sampling a noise signal from a pixel pix_out1. For descriptive convenience, a voltage Va at a node "a" in FIG. 5A is 0, and no charge is accumulated in the holding capacitance Ct1n at t=0. The holding capacitance Ct2s is a sample/hold capacitance for sampling an optical signal from a pixel pix_out2 different from the pixel for the holding capacitance Ct1n. Vb represents a voltage at a node "b" in FIG. 5A at t=0. At t=0, the first N output line 170b and second S output line 170d have been reset to a ground potential. The voltages across the capacitances Ch1n, Ch2s, and Cp are 0, and no charge is accumulated by them.

Assume that Ct1n=Ct2s=Ct, and Ch1n=Ch2s=Ch. Letting Vd be the potential of the second S output line 170d at t=t1, equation (1) is established under the foregoing conditions according to principle of conservation of charge:

$$Ct \times Vb = [Ct + Ch + \{Cp \times (Ct+Ch)\}/\{Cp+Ct+Ch\}] \times Vd \quad (1)$$

Solving equation (1) for Vd yields $$Vd = Ct/[Ct+Ch+\{Cp \times (Ct+Ch)\}/\{Cp+Ct+Ch\}] \times Vb \quad (2)$$

A potential Vc of the first N output line 170b at t=t1 can be expressed using Vd:

$$Vc = Cp/(Ct+Ch+Cp) \times Vd \quad (3)$$

Substituting equation (2) into equation (3) yields $$Vc = Cp/(Ct+Ch+Cp) \times Ct/[Ct+Ch+ \quad (4)$$
$$\{Cp \times (Ct+Ch)\}/\{Cp+Ct+Ch\}] \times Vb$$
$$= Cp \times Ct/[(Ct+Ch) \times (2 \times Cp + Ct + Ch)] \times Vb$$

For Ct, Ch>>Cp, the following expression is approximated:

$$2 \times Cp + Ct + Ch \approx Ct + Ch \quad (5)$$

Cp is represented as a function of Ch:

$$Cp = a \times Ch \; (\underline{a} \text{ is a positive decimal}) \quad (6)$$

Substituting equations (5) and (6) into equation (4) yields $$Vc = a \times Ch \times Ct/(Ct+Ch)2 \times Vb \quad (7)$$

Equation (7) reveals that a larger coefficient a of Cp raises the voltage Vc, which is originally 0, and increases the crosstalk amount.

If the coupling capacitance Cp is 0, a=0 according to equation (6). No crosstalk occurs between the first N output line 170b and the second S output line 170d in the equivalent circuits of FIGS. 5A and 5B.

This concept can also apply to calculate crosstalk between other output lines such as crosstalk from the first S output line 170a to the second N output line 170c and that from the first S output line 170a to the second S output line 170d.

If the crosstalk is contained equally in optical and noise signals, it can be removed by calculating the differences between optical and noise signals by the subsequent differential amplifiers 150a and 150b. In practice, however, noise arising from crosstalk cannot be removed owing differences between the coupling capacitances of output lines arising from differences between the distances between lines.

For example, crosstalk (Cp1+Cp2) affecting the first S output line 170a shown in FIG. 4 differs from crosstalk (Cp3+Cp4) affecting the first N output line 170b. For this reason, a difference signal generated by the differential amplifier 150a still contains noise arising from crosstalk:

$$N1=k1\{(Cp1+Cp2)-(Cp3+Cp4)\} \quad (8)$$

where k1 is a predetermined coefficient.

For example, crosstalk (Cp1+Cp3) affecting the second S output line 170d differs from crosstalk (Cp2+Cp4) affecting the second N output line 170c. Thus, a difference signal generated by the differential amplifier 150b still contains noise arising from crosstalk:

$$N2=k2\{(Cp1+Cp3)-(Cp2+Cp4)\} \quad (9)$$

where k2 is a predetermined coefficient.

Assume that a dummy pattern is formed of a substance having the same dielectric constant as a color filter so as to cover the output line group 160. In this case, the coupling capacitances Cp1 to Cp4 increase at almost the same ratio in proportion to the dielectric constant. Both noise N1 given by equation (8) and noise N2 given by equation (9) may rise.

A large coupling capacitance between output lines attenuates an output level from the readout circuit to the output line. Readout of a signal from the readout circuit to the output line is determined by the following relationship between two capacitances. One capacitance is a holding capacitance Ct which is included in the readout circuit to hold optical and noise signals from a pixel. The other is a capacitance Ch including a wiring capacitance generated between the output line and mainly the ground point, and capacitances between the source and gate of a switch connected to the output line and between its source and back gate. That is, a signal is read out from the readout circuit to the output line at a gain determined by the capacitive division ratio Ct/(Ct+Ch). A coupling capacitance generated between output lines raises the capacitance Ch and thus decreases the capacitive division ratio, attenuating an output from the readout circuit. If an optical signal output S greatly attenuates, the S/N (Signal to Noise) ratio decreases, that is, the S/N (Signal to Noise) ratio becomes difficult to keep high.

To solve this, according to the first embodiment, no color filter exists above the output line formation region 401, and air (or vacuum) occupies the opening 310a. This structure decreases the dielectric constant between output lines, compared to a conventional photoelectric conversion apparatus in which a color filter higher in dielectric constant than air exists above output lines. This means a smaller coupling capacitance between output lines than that in the conventional photoelectric conversion apparatus. The coupling capacitances Cp1 to Cp4 decrease at almost the same ratio in proportion to the dielectric constant. Decrease in a coupling capacitance is equivalent to decrease in a coefficient a in equation (7), reducing the crosstalk amount. The smaller crosstalk amount between output lines allows readout from the holding capacitance to the output line with less noise. That is, both noise N1 given by equation (8) and noise N2 given by equation (9) decrease.

Equation (2) reveals that the optical signal Vb accumulated in the readout circuit 130 attenuates due to the presence of the coupling capacitance Cp when transferred to the second S output line 170d. When outputting a signal from the readout circuit as shown in FIG. 1, the coupling capacitance Cp affects the capacitive division ratio which determines a gain. More specifically, Cp is added to Ch to change the capacitive division ratio from Ct/(Ct+Ch) to Ct/(Ct+Ch+Cp). However, the first embodiment can suppress the signal attenuation on the output line by decreasing the dielectric constant on the output line and decreasing the coupling capacitance between the output lines. As a result, high S/N ratio can be maintained.

As described above, in the first embodiment, since no color filter is formed on output lines, this can reduce crosstalk generated upon capacitive coupling between them. Decreasing the coupling capacitance between output lines makes it possible to reduce crosstalk, decrease the signal attenuation on the output line, and maintain high S/N ratio. The embodiment is also effective for downsizing the chip because it can suppress an increase in coupling capacitance as the distance between output lines shortens.

The first embodiment can provide a photoelectric conversion apparatus capable of reducing crosstalk generated between output lines, obtaining a signal with good color reproduction, and reducing the chip size at high S/N ratio while making a flat upper face of a color filter layer in the photoelectric conversion region.

In the first embodiment, "no color filter is formed on output lines" means a state where a projected figure of the color filter does not overlap the output lines when the color filter is projected in the direction perpendicularly to a surface of the semiconductor substrate on a plane on which output lines are arranged. As shown in the sectional view of FIG. 4, the color filter layer 310 does not overlap the output line group 160 if the color filter layer 310 moved perpendicularly to the surface SBa of the semiconductor substrate SB on a plane on which the output line group 160 is arranged.

Further, "no color filter is formed on output lines" means a state in which margins 240 and 230 are set as follows in the schematic sectional view of FIG. 6. The margin 240 is defined between a color filter boundary X and an output line boundary Y. The margin 230 is defined between the color filter boundary X and an end Z of a semiconductor region (drain or source) 220 of the horizontal transfer switch 250.

Figure 6:
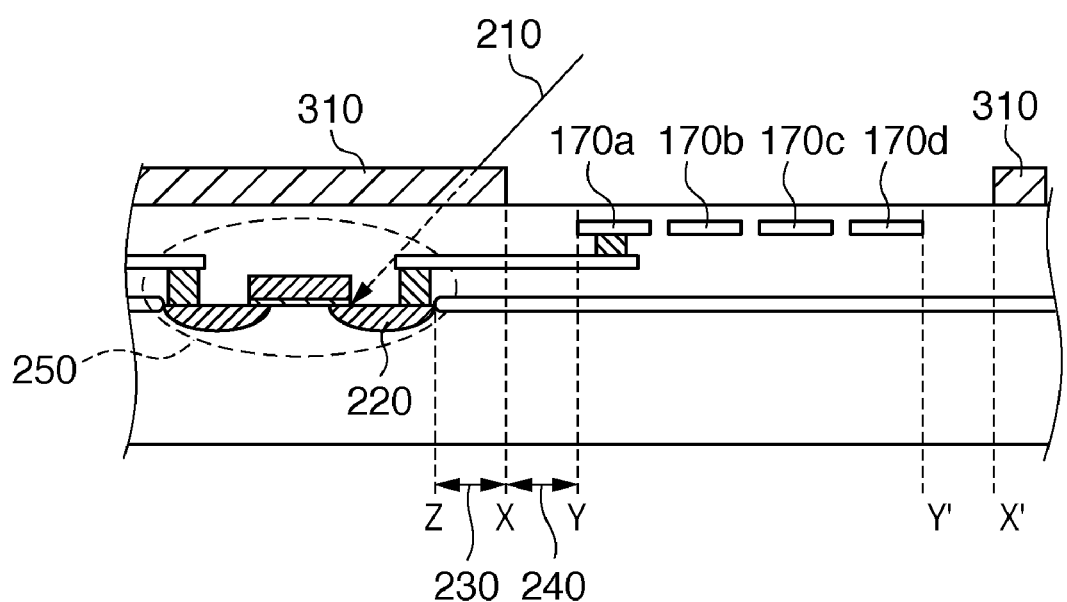
FIG. 6 is a schematic sectional view of a region surrounded by a dotted frame B in FIG. 1.

In FIG. 6, the margin 240 is basically designed to make a coupling capacitance generated on the boundary side (the side of the color filter boundary X) of the first S output line 170a equivalent to that generated between the output lines though it depends on the process conditions, chip size, layout conditions, and the like.

The margin 230 is designed to an interval capable of shielding incident light and scattered light 210 in order to prevent the incident light or scattered light 210 from reaching the semiconductor region 220 of a MOS transistor such as a transfer switch and changing an optical signal owing to charges generated by photoelectric conversion. For example, the margin 230 is set to about 1 μm or more, for example, about 10 μm in terms of the relationship between the film thickness from the semiconductor region 220 to the color filter and the incident angle of incident light. Note that an imaging system using the photoelectric conversion apparatus mainly determines the incident angle of incident light.

In FIG. 6, X' and Y' can also have the same positional relationship as that between X and Y in order to obtain the same effects as those described above.

Also, X' can take the same positional relationship as that between X and Z in the semiconductor region (source or drain) of a transistor in the horizontal scanning circuit 140.

The passivation layer 320 is formed on the output line group 160 in the first embodiment, but the present invention is not exclusive to this. Regardless of the presence/absence of the passivation layer, the sum of the dielectric constants of substances present on the path of a power line connecting output lines is smaller than that in a case in which a color filter is formed on output lines. This leads to a small coupling capacitance between output lines. Hence, the effects described in the embodiment can be obtained regardless of the presence/absence of the passivation layer on output lines. This also applies to the following embodiments.

The opening 310a of the color filter layer 310 may also be filled with an insulator lower in dielectric constant than each of color filters. For example, the photoelectric conversion apparatus may further include a low-dielectric-constant layer 340, as shown in FIG. 7. The low-dielectric-constant layer 340 is arranged to fill the opening 310a of the color filter layer 310. The low-dielectric-constant layer 340 is lower in dielectric constant than each of color filters in the color filter layer 310. The low-dielectric-constant layer 340 is formed of, for example, a molding resin. Even this structure can reduce the coupling capacitance between output lines in comparison with a conventional photoelectric conversion apparatus having a color filter on the output line group 160. The same effects as those of the first embodiment can be attained.

The effects of the first embodiment can be attained even when microlenses 610 are formed on the output line group 160, as shown in FIG. 8.

The layout of the output lines of the output line group 160 is not limited to the order of the first S output line 170a, first N output line 170b, second N output line 170c, and second S output line 170d from the side of the readout circuit 130. The same effects as those described above can also be obtained when the first S output line 170a, first N output line 170b, second S output line 170d, and second N output line 170c are arranged in the order named from the side of the readout circuit 130 in the output line group 160.

Even three or more pairs of first and second output lines in the output line group 160 can provide the same effects as those described above.

The pixel array PA is not limited to the two-dimensional array of pixels, and a one-dimensional array of pixels can also obtain the same effects as those described above. When the pixel array PA is formed by one-dimensionally arraying pixels, the photoelectric conversion apparatus is a line sensor such as a photometer or auto-focus sensor, and the pixel array region IA is, for example, a region which receives light reflected by an object.

Figure 9:
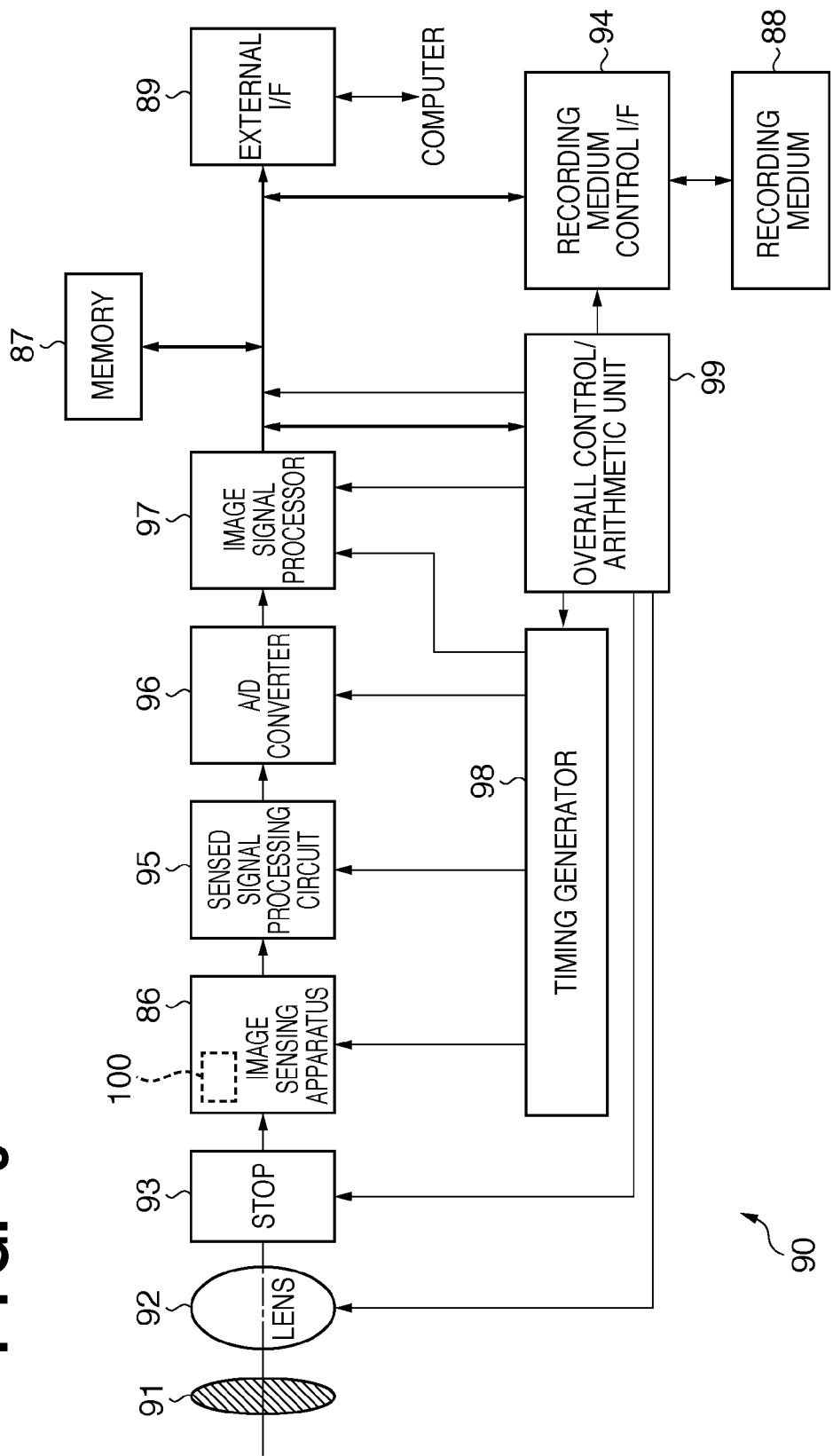
FIG. 9 is a block diagram showing the configuration of an imaging system to which the photoelectric conversion apparatus according to the first embodiment is applied.

FIG. 9 shows an example of an imaging system to which the photoelectric conversion apparatus of the present invention is applied.

As shown in FIG. 9, an imaging system 90 mainly includes an optical system, image sensing apparatus 86, and signal processing unit. The optical system mainly includes a shutter 91, lens 92, and stop 93. The signal processing unit mainly includes a sensed signal processing circuit 95, A/D converter 96, image signal processor 97, memory 87, external I/F 89, timing generator 98, overall control/arithmetic unit 99, recording medium 88, and recording medium control I/F 94. The signal processing unit may not include the recording medium 88.

The shutter 91 is arranged in front of the lens 92 on the optical path to control the exposure.

The lens 92 refracts incident light to form an object image on the pixel array (image sensing surface) of the photoelectric conversion apparatus 100 of the image sensing apparatus 86. Alternatively, the lens 92 refracts incident light to guide the light reflected by an object to the pixel array (image sensing surface) of the photoelectric conversion apparatus 100 of the image sensing apparatus 86.

The stop 93 is interposed between the lens 92 and the photoelectric conversion apparatus 100 on the optical path. The stop 93 adjusts the quantity of light guided to the photoelectric conversion apparatus 100 after passing through the lens 92.

The photoelectric conversion apparatus 100 of the image sensing apparatus 86 converts an object image (or light reflected by an object) formed on the pixel array into an image signal. The image sensing apparatus 86 reads out the image signal from the photoelectric conversion apparatus 100, and outputs it.

The sensed signal processing circuit 95 is connected to the image sensing apparatus 86, and processes an image signal output from the image sensing apparatus 86.

The A/D converter 96 is connected to the sensed signal processing circuit 95. The A/D converter 96 converts a processed image signal (analog signal) output from the sensed signal processing circuit 95 into a digital signal.

The image signal processor 97 is connected to the A/D converter 96. The image signal processor 97 performs various arithmetic processes such as correction for an image signal (digital signal) output from the A/D converter 96, generating image data. The image signal processor 97 supplies the image data to the memory 87, external I/F 89, overall control/arithmetic unit 99, recording medium control I/F 94, and the like.

The memory 87 is connected to the image signal processor 97, and stores image data output from the image signal processor 97.

The external I/F 89 is connected to the image signal processor 97. Image data output from the image signal processor 97 is transferred to an external device (e.g., personal computer) via the external I/F 89.

The timing generator 98 is connected to the image sensing apparatus 86, sensed signal processing circuit 95, A/D converter 96, and image signal processor 97. The timing generator 98 supplies timing signals to the image sensing apparatus 86, sensed signal processing circuit 95, A/D converter 96, and image signal processor 97. The image sensing apparatus 86, sensed signal processing circuit 95, A/D converter 96, and image signal processor 97 operate in synchronism with the timing signals.

The overall control/arithmetic unit 99 is connected to the timing generator 98, image signal processor 97, and recording medium control I/F 94, and controls all of them.

The recording medium 88 is detachably connected to the recording medium control I/F 94. Image data output from the image signal processor 97 is recorded on the recording medium 88 via the recording medium control I/F 94.

With this arrangement, the photoelectric conversion apparatus 100 can provide a high-quality image (image data) as long as it can obtain a high-quality image signal.

Figure 10:
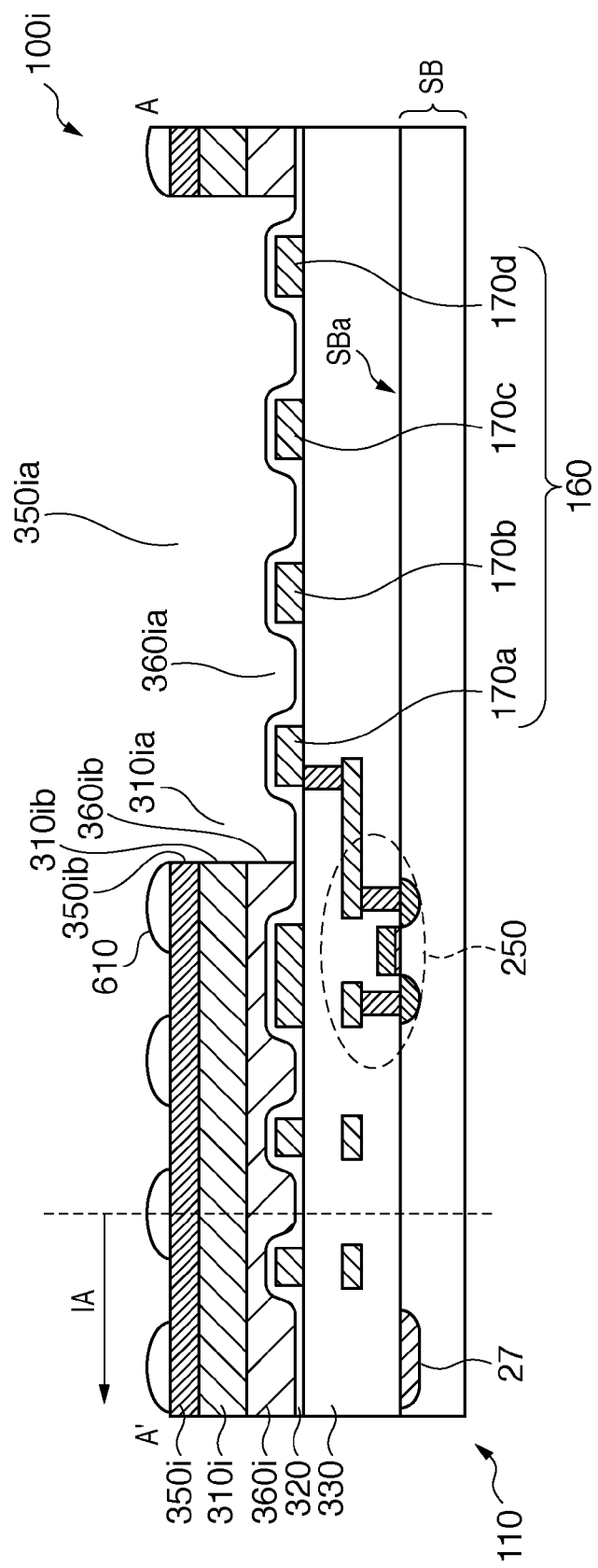
FIG. 10 is a sectional view of the structure of a photoelectric conversion apparatus according to the second embodiment of the present invention.

A photoelectric conversion apparatus 100i according to the second embodiment of the present invention will be described with reference to FIG. 10. FIG. 10 is a sectional view showing the structure of the photoelectric conversion apparatus 100i according to the second embodiment of the present invention. FIG. 10 is a sectional view of a position corresponding to that in FIG. 4 according to the first embodiment. A difference from the first embodiment will be mainly explained.

As shown in FIG. 10, the photoelectric conversion apparatus 100i includes an upper planarization layer 350i on a color filter layer 310i and a lower planarization layer 360i below it.

Each of color filters in the color filter layer 310i is formed of an acrylic resin matching the color filtering characteristic. The color filter layer 310i has an opening 310ia above an output line group 160.

The upper planarization layer 350i is arranged to prevent steps corresponding to the upper face of the color filter layer 310i from appearing on the upper face of the upper planarization layer 350i. The upper planarization layer 350i can therefore assure the flatness of a face on which microlenses 610 are arranged. The upper planarization layer 350i is formed of, for example, an acrylic resin. The upper planarization layer 350i has an opening (another opening) 350ia aligned with the opening 310ia. That is, the upper planarization layer 350i extends to surround a plurality of output lines 170a to 170d when viewed from a direction perpendicular to a surface SBa of a semiconductor substrate SB. The upper planarization layer 350i has the opening 350ia above the output lines 170a to 170d.

The lower planarization layer 360i is arranged to prevent steps corresponding to the upper face of a passivation layer 320 from appearing on the upper face of the lower planarization layer 360i. Hence, the lower planarization layer 360i can assure the flatness of a face on which the color filter layer 310i is arranged. The lower planarization layer 360i is formed of, for example, an acrylic resin. The lower planarization layer 360i has an opening 360ia aligned with the opening 310ia. That is, the lower planarization layer 360i extends to surround the output lines 170a to 170d when viewed from a direction perpendicular to the surface SBa of the semiconductor substrate SB. The lower planarization layer 360i has the opening 360ia above the output lines 170a to 170d.

In this structure, not only the color filter layer 310i but also the lower planarization layer 360i and upper planarization layer 350i have openings above the output line group 160. A side face 350ib of the opening 350ia of the upper planarization layer 350i, a side face 310ib of the opening 310ia of the color filter layer 310i, and a side face 360ib of the opening 360ia of the lower planarization layer 360i can be made continuous.

This structure of the photoelectric conversion apparatus 100i can be formed through the following steps (manufacturing method).

In a first step, a pixel array PA is formed in and on a semiconductor substrate SB (see FIG. 4) in a pixel array region IA (see FIG. 1). A readout circuit 130, output unit 150, and output line group 160 are formed above the semiconductor substrate SB in a peripheral region PR.

In a second step, a third resin layer is formed on a passivation layer 320 above the entire surface (pixel array region IA and peripheral region PR) of the semiconductor substrate SB. The third resin layer is a layer to be formed into the lower planarization layer 360i. Then, a first resin layer including a plurality of color filters is formed on the third resin layer above the entire surface (pixel array region IA and peripheral region PR) of the semiconductor substrate SB. The first resin layer is a layer to be formed into the color filter layer 310i.

In a third step, a second resin layer is formed on the first resin layer above the entire surface (pixel array region IA and peripheral region PR) of the semiconductor substrate SB. The second resin layer is a layer to be formed into the upper planarization layer 350i.

In a fourth step, the upper face of the second resin layer is planarized.

In a fifth step, portions of the third, first, and second resin layers that are positioned above the output line group 160 are removed. As a result, a lower planarization layer 360i, color filter layer 310i, and upper planarization layer 350i which extend to surround the output line group 160 are formed with openings 360ia, 310ia, and 350ia above the output line group 160.

With these steps (manufacturing method), it is possible to ensure the flatness of the upper face of the upper planarization layer 350i. In addition, it is possible to obtain a continuous face including the side face 350ib of the opening 350ia, the side face 310ib of the opening 310ia, and the side face 360ib of the opening 360ia.

Note that, when viewed from a direction perpendicular to the surface SBa of the semiconductor substrate SB, the opening 350ia of the upper planarization layer 350i, the opening 310ia of the color filter layer 310i, and the opening 360ia of the lower planarization layer 360i can have similar shapes with their widths decreasing stepwise. The openings 350ia, 310ia, and 360ia are sometimes formed with such shapes owing to the difference in etching rate between the third, first, and second resins when portions of them that are positioned above the output line group 160 are etched in the fifth step.

No microlens is formed on the output line group 160 in FIG. 10, but may also be arranged on the output line group 160 as described in a modification (FIG. 8) to the first embodiment. Regardless of the presence/absence of the microlens on the output line group 160, the sum of the dielectric constants of substances present on the path of a power line connecting output lines is smaller than that in a case in which a color filter is formed on the output line group 160. Thus, the coupling capacitance between output lines decreases. The effects of the present invention can therefore be obtained regardless of the presence/absence of the microlens on the output line group 160.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-179468, filed Jul. 9, 2008, which is hereby incorporated by reference herein in its entirety.

What is claimed is:

1. A photoelectric conversion apparatus having a pixel array region and a peripheral region positioned at a periphery of the pixel array region, the apparatus comprising:
   a pixel array which is arranged in the pixel array region and has a plurality of pixels arrayed;
   a readout unit which is arranged in the peripheral region to read out a signal from the pixel array;
   an output unit which is arranged in the peripheral region;
   a plurality of output lines which are arranged in the peripheral region to transfer signals from the readout unit to the output unit; and
   a color filter layer which is arranged in the pixel array region and the peripheral region and includes a color filter arranged above the plurality of pixels,
   wherein the color filter layer extends to surround the plurality of output lines when viewed from above the plurality of output lines, and has an opening arranged above the plurality of output lines, and
   the opening of the color filter layer is filled with either of gas and an insulator lower in dielectric constant than the color filter.

2. The apparatus according to claim 1, wherein the readout unit includes a holding capacitance which holds a signal read out from one of the pixels, and a switch which connects or disconnects the holding capacitance and one of the output lines.

3. The apparatus according to claim 1, further comprising a passivation layer which covers the plurality of output lines and is arranged below the color filter layer in the pixel array region,
   wherein the opening of the color filter layer exposes a portion of a surface of the passivation layer that is positioned above the plurality of output lines.

4. The apparatus according to claim 1, further comprising a planarization layer which is arranged on the color filter layer in the pixel array region and the peripheral region,
   wherein the planarization layer has an opening aligned with the opening of the color filter layer, and
   a side face of the opening of the color filter layer and a side face of the opening of the passivation layer form a continuous face.

5. The apparatus according to claim 1, wherein the plurality of output lines includes a plurality of pairs, each of the pairs including a first output line for transferring a first signal output from the readout unit and a second output line for transferring a second signal output from the readout unit.

6. The apparatus according to claim 5, wherein the output unit includes a plurality of differential circuits, each of which generates a difference signal between one of the first signals and one of the second signals.

7. A photoelectric conversion apparatus having a pixel array region and a peripheral region positioned at a periphery of the pixel array region, the apparatus comprising:
   a pixel array which is arranged in the pixel array region and has a plurality of pixels arrayed;
   a readout unit which is arranged in the peripheral region to read out a signal from the pixel array;
   an output unit which is arranged in the peripheral region;
   a plurality of output lines which are arranged in the peripheral region to transfer signals from the readout unit to the output unit;
   a color filter layer which is arranged in the pixel array region and the peripheral region and includes a color filter arranged above the plurality of pixels;
   a passivation layer which covers the plurality of output lines below the color filter layer; and
   a planarization layer which is arranged on the color filter layer in the pixel array region and the peripheral region,
   wherein the readout unit includes a holding capacitance which holds a signal read out from one of the pixels, and a switch which connects or disconnects the holding capacitance and one of the output lines,
   the plurality of output lines includes a plurality of pairs, each of the pairs including a first output line for transferring a first signal output from the readout unit and a second output line for transferring a second signal output from the readout unit,
   the output unit includes a plurality of differential circuits, each of which generates a difference signal between one of the first signals and one of the second signals,
   the color filter layer extends to surround the plurality of output lines when viewed from above the plurality of output lines, and has an opening arranged above the plurality of output lines,
   the opening of the color filter layer is filled with either of gas and an insulator lower in dielectric constant than the color filter, and exposes a portion of a surface of the passivation layer that is positioned above the plurality of output lines,
   the planarization layer has an opening aligned with the opening of the color filter layer, and
   a side face of the opening of the color filter layer and a side face of the opening of the passivation layer form a continuous face.

8. A photoelectric conversion apparatus having a pixel array region and a peripheral region positioned at a periphery of the pixel array region, the apparatus comprising:
   a pixel array which is arranged in the pixel array region and has a plurality of pixels arrayed;
   a readout unit which is arranged in the peripheral region to read out a signal from the pixel array;
   an output unit which is arranged in the peripheral region;
   a plurality of output lines which are arranged in the peripheral region to transfer signals from the readout unit to the output unit;
   a color filter layer which is arranged in the pixel array region and the peripheral region and includes a color filter arranged above the plurality of pixels;
   a passivation layer which covers the plurality of output lines below the color filter layer; and
   a planarization layer which is arranged on the color filter layer in the pixel array region and the peripheral region,
   wherein the readout unit includes a holding capacitance which holds a signal read out from one of the pixels, and a switch which connects or disconnects the holding capacitance and one of the output lines,
   the plurality of output lines include a plurality of pairs, each of the pairs including a first output line for transferring a first signal output from the readout unit and a second output line for transferring a second signal output from the readout unit,
   the output unit includes a plurality of differential circuits, each of which generates a difference signal between one of the first signals and one of the second signals,
   the color filter layer and the planarization layer extend to surround the plurality of output lines when viewed from above the plurality of output lines, and
   the color filter layer and the planarization layer expose a portion of a surface of the passivation layer that is positioned above the plurality of output lines, a space above the surface being filled with either of gas and an insulator lower in dielectric constant than the color filter.

9. An imaging system comprising:
   a photoelectric conversion apparatus defined in claim 1;
   an optical system which guides light to the pixel array of the photoelectric conversion apparatus; and
   a signal processing unit which processes a signal output from the photoelectric conversion apparatus to generate image data.

10. An imaging system comprising:
    a photoelectric conversion apparatus defined in claim 7;
    an optical system which guides light to the pixel array of the photoelectric conversion apparatus; and
    a signal processing unit which processes a signal output from the photoelectric conversion apparatus to generate image data.

11. An imaging system comprising:
    a photoelectric conversion apparatus defined in claim 8;
    an optical system which guides light to the pixel array of the photoelectric conversion apparatus; and
    a signal processing unit which processes a signal output from the photoelectric conversion apparatus to generate image data.

12. A method of manufacturing a photoelectric conversion apparatus having a pixel array region and a peripheral region positioned at a periphery of the pixel array region, the method comprising steps of:

forming, in the pixel array region, a pixel array having a plurality of pixels arrayed, and forming, in the peripheral region, a readout unit which reads out a signal from the pixel array, an output unit, and a plurality of output lines which transfer signals transferred from the readout unit to the output unit;

forming a first resin layer including a color filter in the pixel array region and the peripheral region;

forming a second resin layer on the first resin layer in the pixel array region and the peripheral region;

planarizing an upper face of the second resin layer; and removing portions of the first resin layer and second resin layer that are positioned above the plurality of output lines, thereby forming openings in the first resin layer and the second resin layer, wherein the openings of the first resin layer and the second resin layer are filled with either of gas and an insulator lower in dielectric constant than the color filter.

* * * * *